(12) United States Patent
Hirler et al.

(10) Patent No.: US 8,907,340 B2
(45) Date of Patent: Dec. 9, 2014

(54) SEMICONDUCTOR ARRANGEMENT WITH AN INTEGRATED HALL SENSOR

(75) Inventors: Franz Hirler, Isen (DE); Walter Rieger, Arnoldstein (AT); Lutz Goergens, Oberasbach (DE); Helmut Angerer, Villach (AT); Gianmauro Pozzovivo, Villach (AT); Markus Zundel, Egmating (DE)

(73) Assignee: Infineon Technologies Austria AG, Villach (AT)

( * ) Notice: Subject to any disclaimer, the term of this patent is extended or adjusted under 35 U.S.C. 154(b) by 84 days.

(21) Appl. No.: 13/241,627

(22) Filed: Sep. 23, 2011

(65) Prior Publication Data

US 2013/0075724 A1 Mar. 28, 2013

(51) Int. Cl.
*H01L 23/58* (2006.01)
*H01L 27/06* (2006.01)
*B82Y 10/00* (2011.01)
*H01L 27/22* (2006.01)
*H01L 43/06* (2006.01)
*H01L 29/778* (2006.01)

(52) U.S. Cl.
CPC ............ *B82Y 10/00* (2013.01); *H01L 27/0617* (2013.01); *H01L 27/22* (2013.01); *H01L 43/065* (2013.01); *H01L 29/7787* (2013.01)
USPC .......................................................... 257/48

(58) Field of Classification Search
CPC .. G01R 33/07; G01R 15/202; G01R 19/0092; G01R 33/06; G01R 33/077; G01R 31/2884; H01L 22/32; H01L 22/34; H01L 2924/14; H01L 2924/01079
USPC .......................................................... 257/48
See application file for complete search history.

(56) References Cited

U.S. PATENT DOCUMENTS

| | | |
|---|---|---|
| 2005/0073293 A1* | 4/2005 | Hastings et al. .......... 324/117 H |
| 2009/0058411 A1* | 3/2009 | Miyoshi et al. ............... 324/251 |
| 2011/0127583 A1 | 6/2011 | Uhlig et al. |

OTHER PUBLICATIONS

Current Sensing Using Linear Hall Sensors by Infineon Technologies AG pp. 1-18 (Feb. 2009).*

\* cited by examiner

*Primary Examiner* — Anthony Ho
(74) *Attorney, Agent, or Firm* — Murphy, Bilak & Homiller, PLLC

(57) ABSTRACT

A semiconductor arrangement includes a semiconductor body and a semiconductor device, the semiconductor device including first and second load terminals arranged distant to each other in a first direction of the semiconductor body and a load path arranged in the semiconductor body between the first and second load terminals. The semiconductor arrangement further includes at least one Hall sensor arranged in the semiconductor body distant to the semiconductor device in a second direction perpendicular to the first direction. The Hall sensor includes two current supply terminals and two measurement terminals.

20 Claims, 6 Drawing Sheets

SEMICONDUCTOR ARRANGEMENT WITH AN INTEGRATED HALL SENSOR

TECHNICAL FIELD

Embodiments of the present invention relate to a semiconductor arrangement with a semiconductor device, such as a transistor, and a current measurement device.

BACKGROUND

Transistors are widely used as switches for switching electrical currents supplied to loads. In many applications it is desired to measure the current through the load. Several different concepts are known for measuring a current through a transistor and a load, respectively.

According to a first concept, a shunt resistor is connected in series with the transistor, and a voltage across the resistor is measured. This voltage, in accordance with Ohm's law, is proportional to the current through the transistor. The shunt resistor, however, causes power losses.

According to a further concept, a measurement transistor is provided that is operated in the same operation point as the load transistor connected in series with the load, so that a measurement current through the measurement transistor is proportional to a load current through the load. Although the load transistor and the measurement transistor can be configured such that the measurement current is much smaller than the load current, losses may occur in connection with the current measurement.

There is a need for a semiconductor arrangement that includes a semiconductor device configured to be connected in series with a load and a measurement device, wherein the measurement device has very low losses and can be integrated with the semiconductor device in a common semiconductor body.

SUMMARY

One embodiment relates to a semiconductor arrangement. The semiconductor arrangement includes a semiconductor body, a semiconductor device, and at least one Hall sensor. The semiconductor device includes first and second load terminals arranged distant to each other in a first direction of the semiconductor body, and a load path arranged in the semiconductor body between the first and second load terminals. The at least one Hall sensor is arranged in the semiconductor body distant to the semiconductor device in a second direction perpendicular to the first direction and includes two current supply terminals and two measurement terminals.

Those skilled in the art will recognize additional features and advantages upon reading the following detailed description, and upon viewing the accompanying drawings.

BRIEF DESCRIPTION OF THE DRAWINGS

Examples will now be explained with reference to the drawings. The drawings serve to illustrate the basic principle, so that only aspects necessary for understanding the basic principle are illustrated. The drawings are not to scale. In the drawings the same reference characters denote like features.

FIG. 1 which includes

FIG. 2 which includes

FIG. 5 which includes

FIG. 6 which includes

DETAILED DESCRIPTION

In the following description, reference is made to the accompanying drawings, which form a part thereof, and in which is shown by way of illustration specific embodiments in which the invention may be practiced. In this regard, directional terminology, such as "top", "bottom", "front", "back", "leading", "trailing" etc., is used with reference to the orientation of the figures being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims. It is to be understood that the features of the various exemplary embodiments described herein may be combined with each other, unless specifically noted otherwise.

Figure 1A:
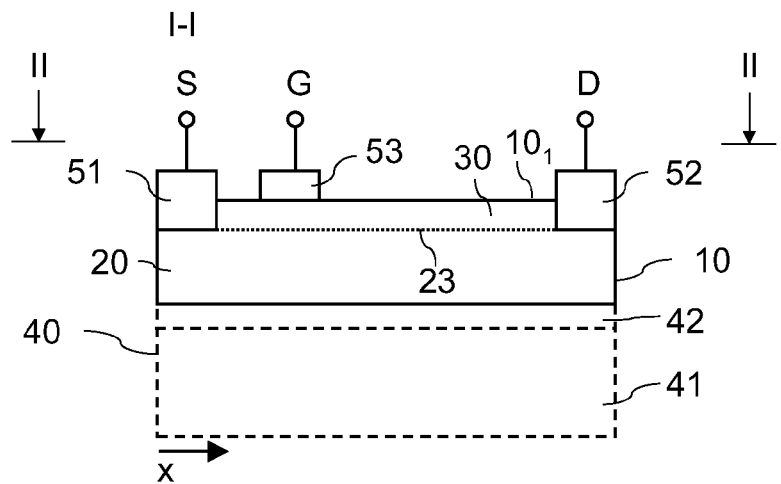
FIGS. 1A to 1C illustrates a first embodiment of a semiconductor arrangement including a semiconductor device implemented as a transistor and a Hall sensor.
Figure 1B:
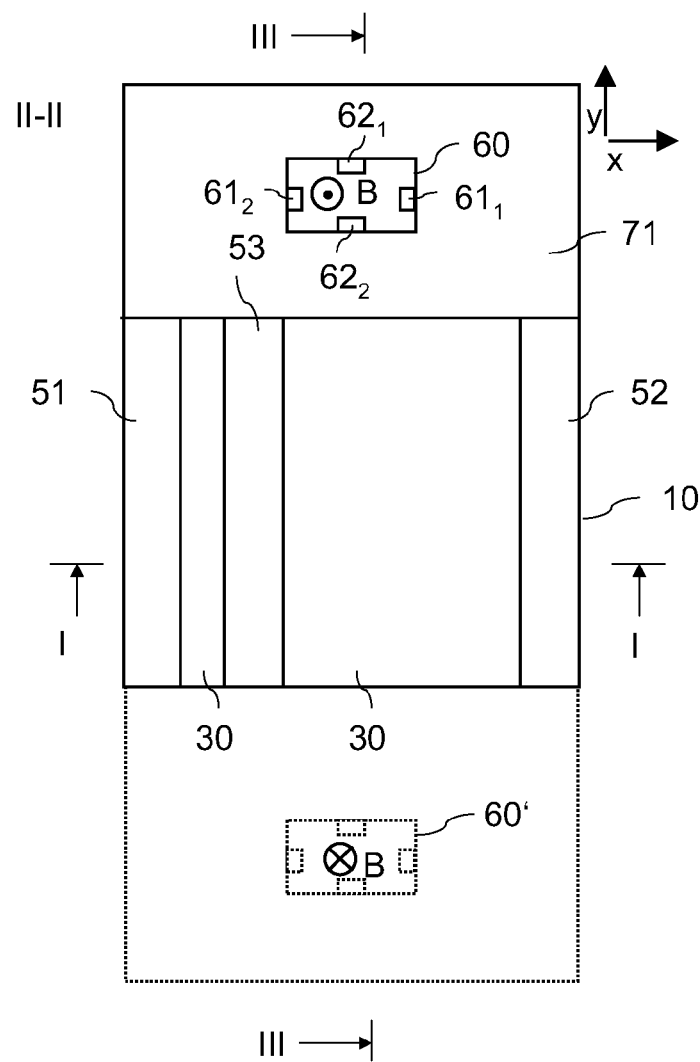
Figure 1C:
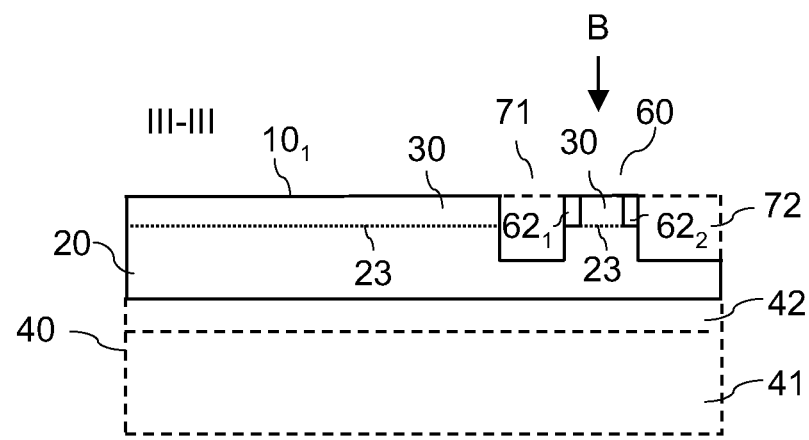

FIGS. 1A to 1C illustrate a first embodiment of a semiconductor arrangement that includes a semiconductor device and a Hall sensor. The semiconductor arrangement includes a semiconductor body 10. FIG. 1A illustrates a vertical cross sectional view of the semiconductor body 10 in a section plane I-I, FIG. 1B illustrates a top view on a first surface $10_1$ of the semiconductor body 10, and FIG. 1C illustrates a vertical cross sectional view in a further vertical section plane III-III. FIG. 1A illustrates a vertical cross sectional view in a region in which the semiconductor device is implemented, and FIG. 1C illustrates a vertical cross sectional view in a region in which the Hall sensor is implemented. FIGS. 1A to 1C only show sections of the semiconductor body 10, namely those sections in which the semiconductor device and the Hall sensor are implemented. In particular in a horizontal direction, the semiconductor body 10 may extend beyond the borders illustrated in FIGS. 1A to 1C.

Referring to FIG. 1A, which shows a vertical cross sectional view of the semiconductor device, the semiconductor device includes first and second load terminals 51, 52 that are arranged distant to each other in a first direction x of the semiconductor body 10. In the embodiment illustrated in FIG. 1A, the first direction x is a horizontal direction of the semiconductor body 10. A load path of the semiconductor device is arranged between the first and second load terminal 51, 52 within the semiconductor body 10. The first and second load terminals 51, 52 may include an electrically conductive material, such as a metal and/or may include doped semiconductor regions.

The semiconductor device of FIG. 1A is implemented as a transistor in which the first load terminal 51 forms a source terminal, the second load terminal 52 forms a drain terminal and which further includes a gate electrode 53. The gate electrode 53 is arranged between the first and second load terminals 51, 52.

In the embodiment illustrated in FIG. 1A, the semiconductor body 10 includes two semiconductor layers, namely a first semiconductor layer 20 and a second semiconductor layer 30 arranged adjacent to each other in a vertical direction of the semiconductor body 10, where the vertical direction of the semiconductor body 10 is a direction perpendicular to the first surface $10_1$. The semiconductor materials of the first and second layers 20, 30 are selected such that there is a two-dimensional electron gas (2DEG) 23 between these semiconductor layers 20, 30. According to one embodiment, the first semiconductor layer 20 includes gallium nitride (GaN), while the second semiconductor layer 30 includes aluminum gallium nitride (AlGaN).

A first section of the 2DEG 23 is part of the load path of the transistor and extends from the first load terminal 51 to the second load terminal 52 in the first direction x of the semiconductor body 10. By virtue of the 2DEG extending between the first and second load terminals 51, 52, the transistor is a normally-on transistor. The gate electrode 53 that is configured to switch the transistor on and off is arranged between the source and drain terminals 51, 52 and is electrically connected to the second layer 30. The gate electrode 53 is arranged distant to the 2DEG 23 in a direction perpendicular to the first direction x. By applying a suitable electrical potential to the gate electrode 53 a depletion region can be generated in the second layer 30 that interrupts the 2DEG 23 so as to switch the transistor off. According to one embodiment, the electrical potential to be applied to the gate electrode 53 in order to switch the transistor off is a negative potential relative to the electrical potential at the source terminal 51.

Referring to FIG. 1A, the semiconductor body 10 may further include a carrier or substrate 40 on which the first and second semiconductor layers 20, 30 are arranged. According to one embodiment, the carrier 40 includes a substrate 41 and a buffer layer 42 arranged between the substrate 41 and the first layer 20. According to one embodiment, the substrate includes silicon (Si), silicon carbide (SiC) or aluminium oxide ($Al_2O_3$). The buffer layer 42 includes, for example, aluminium nitride (AlN).

Referring to FIG. 1B, the Hall sensor 60 is arranged distant to the transistor in a second direction y of the semiconductor body 10. In the embodiment illustrated in FIG. 1B, the second direction y is also a horizontal direction of the semiconductor body 10 and extends perpendicular to the first direction x. The Hall sensor 60 which is also integrated in the semiconductor body 10 includes two (a pair of) current supply terminals $61_1$, $61_2$ and two (a pair of) measurement terminals $62_1$, $62_2$. In the embodiment illustrated in FIG. 1B, the current supply terminals $61_1$, $61_2$ and the measurement terminals $62_1$, $62_2$ are arranged in the region of the first surface $10_1$ of the semiconductor body 10. The current supply terminals $62_1$, $62_2$ are arranged distant to each other in a third direction of the semiconductor body 10 and the measurement terminals $62_1$, $62_2$ are arranged distant to each other in a forth direction of the semiconductor body 10. The third and fourth directions are horizontal directions in the embodiment illustrated in FIG. 1B. According to one embodiment, one of the third and fourth directions corresponds to the first direction x, while the other one of the third and fourth directions corresponds to the second direction y. In the embodiment illustrated in FIG. 1B, the third direction in which the current supply terminals $61_1$, $61_2$ are arranged distant to each other corresponds to the first direction x, while the fourth direction in which the measurement terminals $62_1$, $62_2$ are arranged distant to each other corresponds to the second direction y.

Referring to FIG. 1C, the Hall sensor 60 includes a second section of the 2DEG 23 that extends in a horizontal plane of the semiconductor body 10. According to one embodiment, the current supply terminals $61_1$, $61_2$ (out of view in FIG. 1C) and the measurement terminals $62_1$, $62_2$ extend into the semiconductor body 10 from the first surface $10_1$ and adjoin the 2DEG 23, so that in the Hall sensor 60 the 2DEG 23 extends between the individual current supply terminals $61_1$, $61_2$ and the measurement terminals $62_1$, $62_2$. The current supply terminals $61_1$, $61_2$ and the measurement terminals $62_1$, $62_2$ include, for example, an electrically conductive material, such as a metal, and/or a doped semiconductor region.

The current supply terminals $61_1$, $61_2$ of the Hall sensor 60 are configured to have a current source connected thereto, and the measurement terminals $62_1$, $62_2$ are configured to have a voltage measurement device connected thereto. This will be explained in further detail with reference to FIG. 3. The operating principle of the Hall sensor 60 of FIGS. 1A to 1C corresponds to the operating principle of a conventional Hall sensor. Thus, when a current is driven via the current supply terminals $61_1$, $61_2$ to flow in the third direction through the Hall sensor 60, specifically through the 2DEG 23 in the Hall sensor 60, and when there is a magnetic field B that extends perpendicular to this current flow direction (the third direction) an electrical voltage can be measured at the measurement terminals $62_1$, $62_2$. This voltage increases when a field strength of the magnetic field increases.

A magnetic field B sensed by the Hall sensor 60 may result from a current I flowing via the load path of the transistor between the first and second load terminals 51, 52. When this current increases, the field strength of the magnetic field B increases, so that the voltage that can be measured between the measurement terminals $62_1$, $62_2$ also increases. Thus, the electrical voltage that can be measured between the measurement terminals $62_1$, $62_2$ is dependent on the current I through the load path of the transistor. This electrical voltage is, in particular, proportional to the current I through the transistor. Thus, the Hall sensor 60 may act as a current sensor that senses a current flowing in the transistor.

The Hall sensor 60 may include an offset such that the electrical voltage measured between the measurement terminals $62_1$, $62_2$ is other than 0 even when the current I through the transistor is 0. This offset may result from an external magnetic field, which is a magnetic field not caused by the current flowing in the transistor 10. In order to compensate for this offset the semiconductor arrangement may include a further Hall sensor 60' (illustrated in dotted lines in FIG. 1B). This further Hall sensor 60' can be implemented like the Hall sensor 60 and is also arranged distant to the transistor 10 in the second direction y, with the Hall sensor 60 and the further Hall sensor 60' being arranged adjacent to opposite sides of the drift region 11.

The magnetic field B induced by the current in the transistor 10 has a first direction where it goes through the Hall sensor 60 and an opposite second direction where it goes through the further sensor 60'. The external magnetic field, however, has the same direction in both Hall sensors 60, 60'. The overall magnetic field as sensed by one of the Hall sensors 60, 60' is therefore the sum of the external magnetic field and the magnetic field induced by the current through the transistor 10, while the overall magnetic field as sensed by the other one of the Hall sensors 60, 60' is therefore the difference between the external magnetic field and the magnetic field induced by the current through the transistor 10. The influence of the external magnetic field can therefore be eliminated by forming the difference between the measurement voltage of the one Hall sensor 60 and the measurement voltage of the other Hall sensor 60'. Optionally, the result may be divided by 2.

Referring to FIGS. 1A and 1C, the transistor can be electrically insulated from the Hall sensor 60. For this, a trench 71 may extend into the semiconductor body 10 from the first surface $10_1$ between the transistor and the Hall sensor 60. Optionally, the trench 71 is filled with an electrically insulating material 72, such as an oxide or a nitride. The trench 71 extends through the 2DEG 23, so as to subdivide the 2DEG 23 into the first section in the transistor and the second section in the Hall sensor 60. In the embodiment illustrated in FIGS. 1A to 1C, the trench 71 subdivides the 2DEG 23 and the second layer 30 but does not subdivide the first layer 20, which below the transistor extends from the transistor to the Hall sensor 60. According to one embodiment, the first semiconductor layer 20 is intrinsic. In this case, the resistance of the intrinsic first layer 20 is so high compared with the resistance of the 2DEG 23 that the transistor and the Hall sensor 60 can be considered to be electrically insulated from one another.

Implementing the transistor with a semiconductor layer including gallium nitride and, therefore, implementing the Hall sensor 60 with a semiconductor layer including gallium nitride, has the advantage that the semiconductor arrangement can also be used at high temperatures, such as temperatures up to 400° C. At this temperatures narrow gap semiconductor materials, such as silicon, gallium arsenic (GaAs) or indium antimonide (InSb) which are included in conventional Hall sensors, cannot be used.

Nevertheless, the basic principle of implementing a semiconductor device, such as a transistor, and a Hall sensor in a common semiconductor body and of measuring a current through the semiconductor device by measuring a magnetic field associated with the current using the Hall sensor is, of course, not restricted to a semiconductor body including gallium nitride.

Figure 2A:
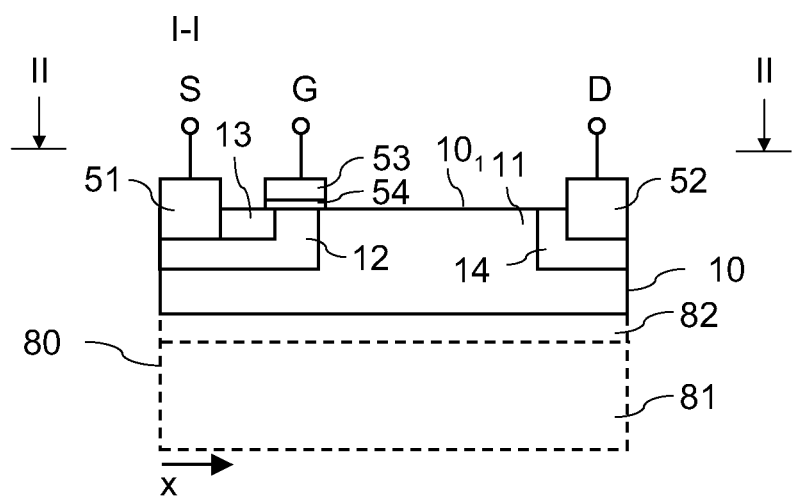
FIGS. 2A to 2C illustrates a second embodiment of a semiconductor arrangement including a semiconductor device implemented as a transistor and a Hall sensor.
Figure 2B:
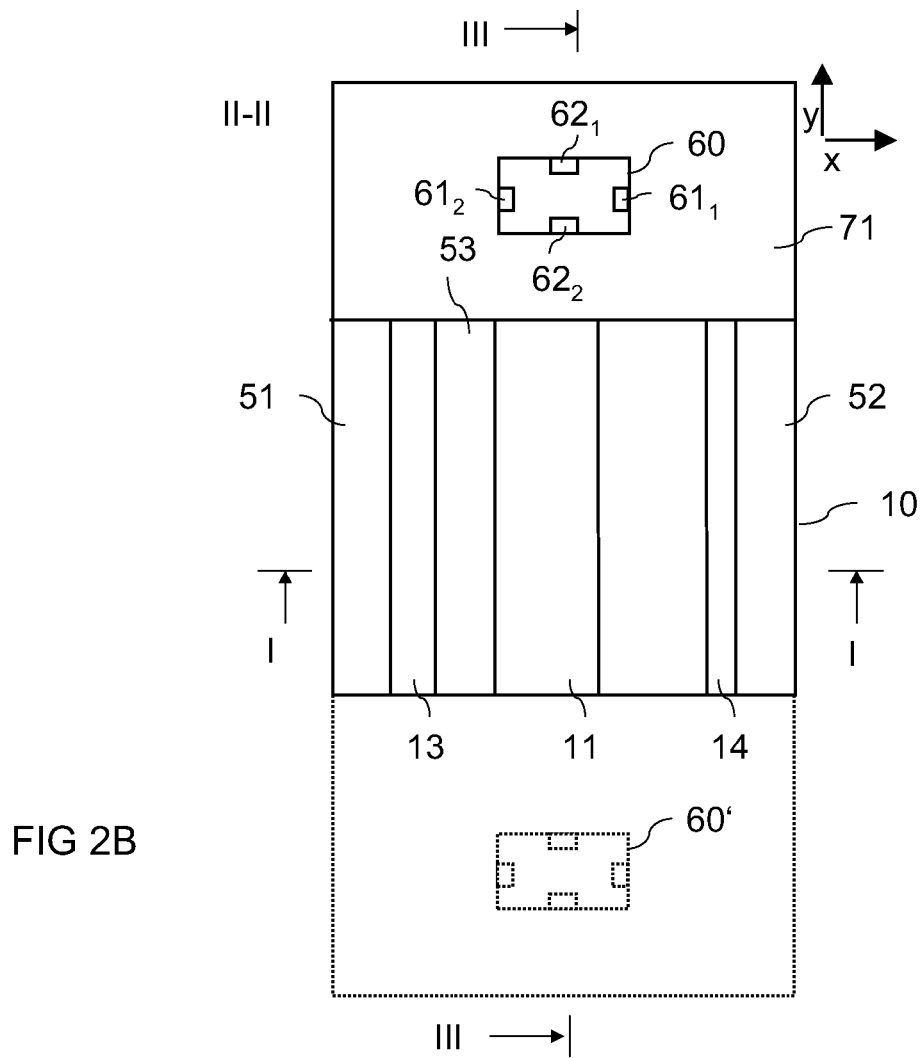
Figure 2C:
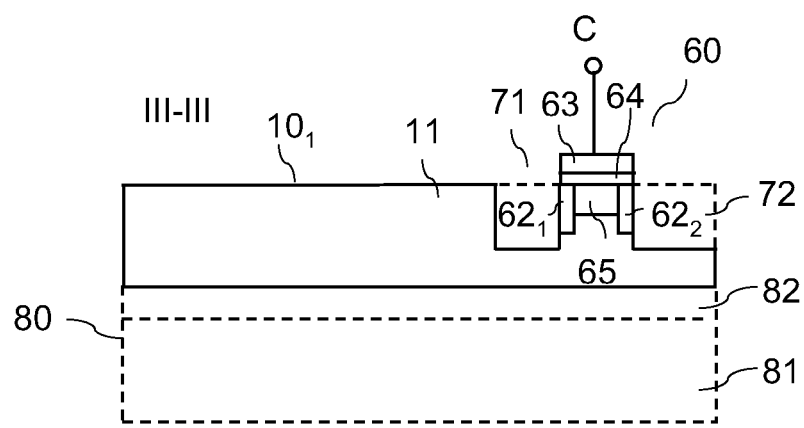

FIGS. 2A to 2C illustrate an embodiment of a semiconductor arrangement including a transistor and a Hall sensor each implemented in a semiconductor body 10. The semiconductor body 10 may include silicon as a semiconductor material. In the embodiment illustrated in FIGS. 2A to 2C, the transistor is implemented like a conventional lateral MOSFET (metal oxide semiconductor field effect transistor) and includes a source region 13 electrically connected to the source terminal 51, a drain region 14 electrically connected to the drain terminal 52 and arranged distant in the first direction x to the source region 13. The transistor further includes a drift region 11 and a body region 12, where the body region 12 is arranged between the source region 13 and the drift region 11, and where the drift region 11 is arranged between the drain region 14 and the body region 12. The gate electrode 53 is arranged adjacent to the body region 12 and is dielectrically insulated from the semiconductor body 10 by a gate dielectric 54. Referring to FIG. 2A, the gate electrode 53 may be arranged on first surface $10_1$ of the semiconductor body 10. However, this is only an example. The gate electrode 53 could also be arranged in a trench extending into the semiconductor body 10 from the first surface $10_1$.

The transistor can be implemented as an n-type MOSFET or as a p-type MOSFET. In an n-type MOSFET, the source and drain regions 13, 14 and the drift region 11 are n-doped, while the body region 12 is p-doped. In a p-type MOSFET the individual semiconductor regions are doped complementarily to the individual semiconductor regions in an n-type MOSFET. The transistor could also be implemented as an IGBT (insulated gate bipolar transistor). In an IGBT the drain region 14 is doped complementarily to the drift region 11. The MOSFET can be implemented as an enhancement (normally-off) MOSFET or as a depletion (normally-on) MOSFET. In an enhancement MOSFET the body region 12 adjoins the gate dielectric 54, while in a depletion MOSFET a channel region (not shown) of the same doping type as the source region 13 and the drift region 11 extends along the gate dielectric 54 between the body region 12 and the gate dielectric 54.

The operating principle of the MOSFET according to FIG. 2A corresponds to the operating principle of a conventional MOSFET. The MOSFET conducts a current (is switched on) when a load voltage is applied between the drain and source terminals D, S and when the gate electrode 53 is biased such that there is a conducting channel in the body region 12 between the source region 13 and the drift region 11. The MOSFET is switched off when the conducting current in the body region 12 is interrupted.

The Hall sensor 60 may correspond to the Hall sensor explained with reference to FIGS. 1A to 1C with the difference that the Hall sensor 60 of FIGS. 2A to 2C does not include a 2DEG. The semiconductor body 10 may include a basic doping concentration which corresponds to a doping concentration of the drift region 11, wherein the source region 13, the body region 12 and the drain region 14 are higher doped regions produced by implanting and/or diffusion processes. A doping type of the body region 12 may be complementary to doping types of the source region 13, the drain region 14 and the drift region 11. The semiconductor region arranged between the current supply terminals $61_1$, $61_2$ and the measurement terminals $62_1$, $62_2$ of the Hall sensor 60 may have a doping concentration corresponding to the basic doping concentration. According to another embodiment, the Hall sensor 60 includes a higher doped region 65 arranged between the current supply terminals $61_1$, $61_2$ and the measurement terminals $62_1$, $62_2$.

Referring to FIG. 2C, the Hall sensor 60 optionally includes a control electrode 63 that extends from the first supply terminal $61_1$ to the second supply terminal $61_2$ in the first direction x, is dielectrically insulated from the semiconductor body 10 by a control dielectric 64 and is arranged above the first surface $10_1$ of the semiconductor body 10. The control electrode 63 is configured to generate a conducting channel along the first surface $10_1$ of the semiconductor body 10 between the first and second supply terminals $61_1$, $61_2$. This conducting channel is an accumulation channel when the semiconductor region between the first and second supply terminals $61_1$, $61_2$ has the same doping type as the first and second supply terminals $61_1$, $61_2$, and is an inversion channel when the semiconductor region between the first and second supply terminals $61_1$, $61_2$ has a doping type that is complementary to the doping type of the first and second supply terminals $61_1$, $61_2$. The conducting channel along the control dielectric 64 is a region with high charge carrier mobility that is similar to a 2DEG between a GaN layer and an AlGaN layer of a semiconductor body. Generation of this high charge carrier mobility region is controlled via a control terminal (C) connected to the control electrode 63.

Like in the embodiment explained with reference to FIGS. 1A to 1C, the Hall sensor 60 can be separated from the transistor by a trench 71 that is optionally filled with an electrically insulating material 72. Further, like in the embodiment according to FIGS. 1A to 1C a further Hall sensor 60' may be provided in the embodiment according to FIGS. 1A to 1C. This further Hall sensor 60' is illustrated in dotted lines in FIG. 2B.

Referring to FIGS. 2A and 2C, the semiconductor body 10 may include a substrate 80 on which a semiconductor layer is arranged in which the drift region 11, the body region 12, the source region 13 and the drain region 14 are formed. The substrate 80 may include a semiconductor substrate 81 and an insulation layer 82 arranged between the substrate 81 and the semiconductor layer with the active transistor regions. The insulation layer 82 is, for example, an oxide layer.

In both the embodiment illustrated in FIGS. 1A to 1C and the embodiment illustrated in FIGS. 2A to 2C, the trench 71 may surround one of the transistor and the Hall sensor 60. In the embodiment illustrated in FIGS. 1B and 2B the trench 71 surrounds the Hall sensor 60.

Figure 3:
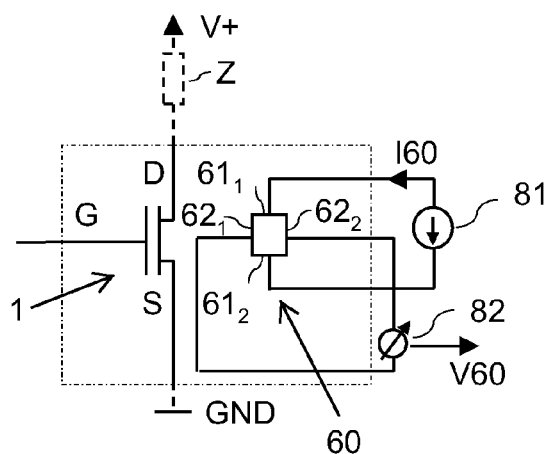
FIG. 3 illustrates a circuit diagram of a semiconductor arrangement including a transistor and a Hall sensor.

FIG. 3 shows an equivalent circuit diagram of the semiconductor arrangement of FIGS. 1A to 1C and 2A to 2C. In the circuit diagram of FIG. 3, reference numeral 1 denotes the transistor and reference numeral 60 denotes the Hall sensor. Referring to FIG. 3, the transistor 1 can be connected in series with a load Z, where the series circuit with the load Z and the transistor 1 can be connected between a terminal for a positive supply potential V+ and a negative supply potential or reference potential GND. The transistor 1 can be switched on and off by providing a suitable drive signal $S_D$ to its gate terminal (G), so that the transistor 1 acts as an electronic switch that switches the load Z on and off. The Hall sensor 60 is arranged in the same semiconductor body 10 (illustrated in dashed and dotted lines in FIG. 3) as the transistor 1. In operation, a current source 81 is connected to the current supply terminals $61_1$, $61_2$ and drives a current I60 through the Hall sensor 60. A voltage measurement device 82 is connected to the measurement terminals $62_1$, $62_2$ and provides a voltage measurement signal V60 that is representative of a voltage between the measurement terminals $62_1$, $62_2$. Since this voltage is also representative of a magnetic field sensed by the Hall sensor 60, and since the magnetic field is dependent on a load current I through the transistor 1, the voltage measurement signal V60 also represent the load current I through the transistor 1.

Figure 4:
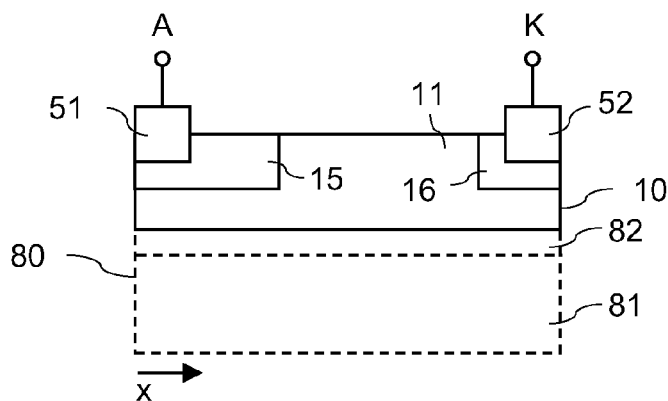
FIG. 4 illustrates an embodiment of a semiconductor device implemented as a diode.

Implementing the semiconductor device as a transistor is only an example. Instead of a transistor the semiconductor device could also be implemented as any other type of semiconductor device that is adapted to conduct a load current. Referring to FIG. 4, the semiconductor device could, for example, be implemented as a diode, in particular, as a p-i-n diode. In the diode the first load terminal 51 is connected to a p-type emitter region 15 and forms an anode terminal A, while the second load terminal 52 is connected to an n-type emitter region 16 and forms a cathode terminal K. Between the first and second emitter regions 15, 16 a drift region or base region 11 is arranged. The drift region 11 is a p-type region or an n-type region and has a doping concentration that is lower than the doping concentrations of the first and second emitter regions 15, 16. Depending on the doping type of the drift region 11, a pn-junction is formed between the first emitter region 15 and the drift region 11 or between the second emitter region 16 and the drift region 11. The diode conducts a current when an electrical voltage is applied between the anode and the cathode terminals A, K that biases the pn-junction in a forward direction. This current to the diode causes a magnetic field that can be sensed by the Hall sensor 60.

Figure 5A:
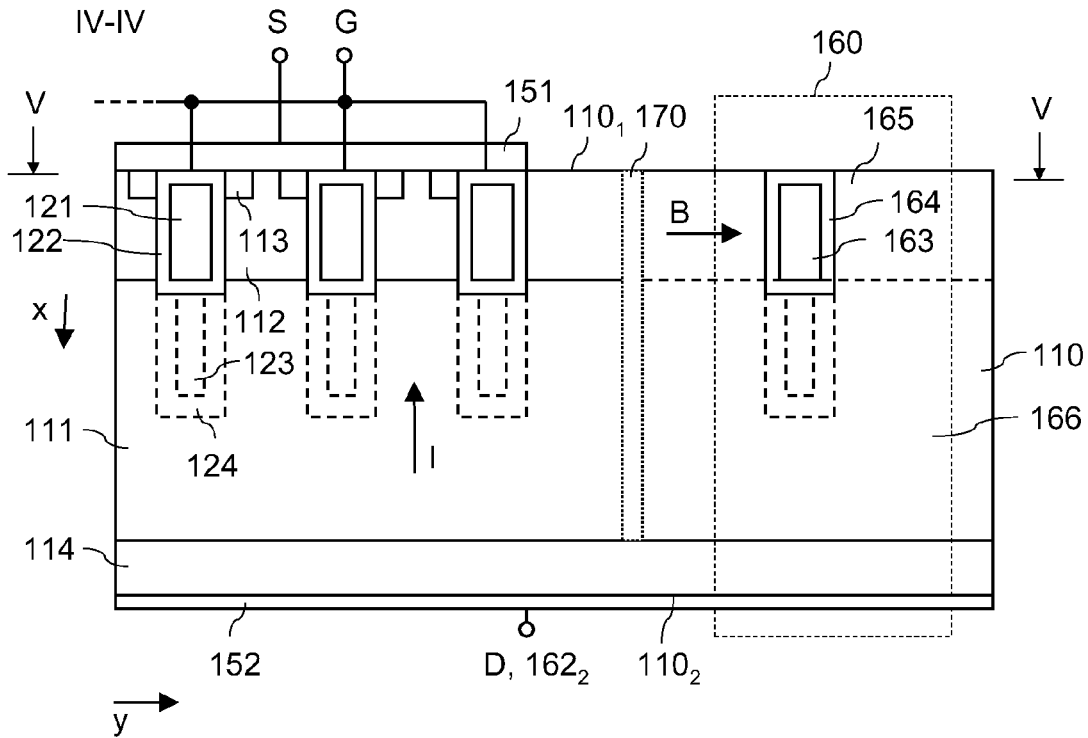
FIGS. 5A to 5C illustrates a third embodiment of a semiconductor arrangement including a semiconductor device implemented as a transistor and a Hall sensor.
Figure 5B:
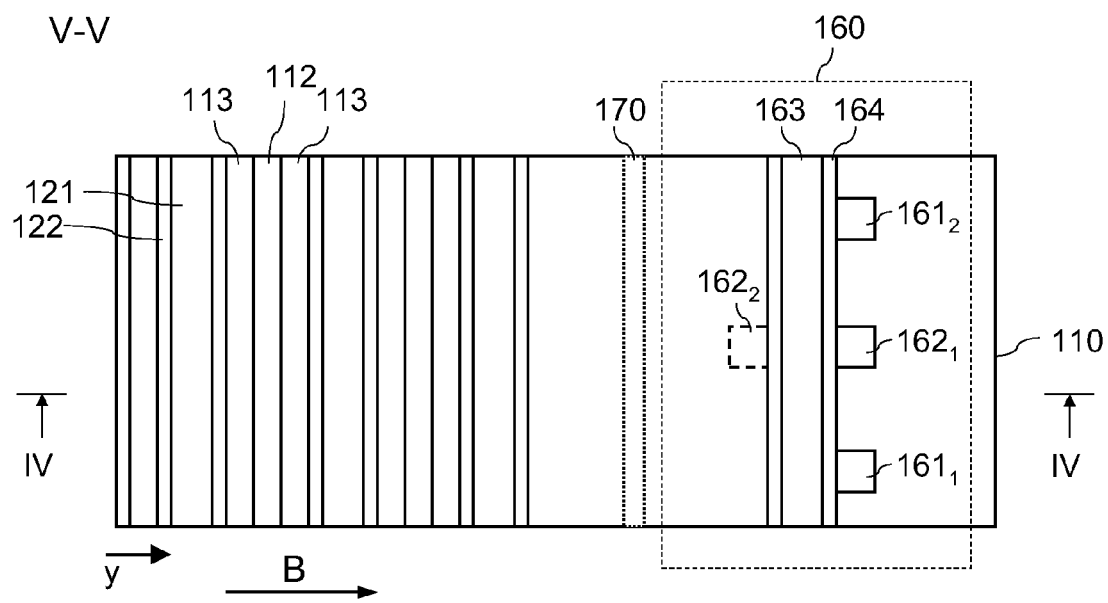
Figure 5C:
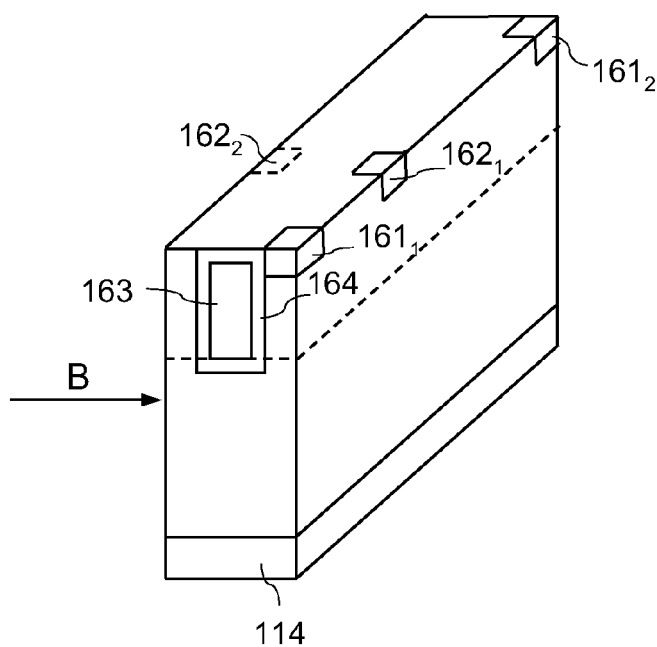

FIGS. 5A to 5C illustrate a further embodiment of a semiconductor arrangement which includes a semiconductor device implemented as a transistor and a Hall sensor 160. The transistor and the Hall sensor 60 are implemented in a common semiconductor body 110 that includes a first surface $110_1$ and a second surface $110_2$. FIG. 5A illustrates a vertical cross sectional view of the semiconductor body 110, FIG. 5B illustrates a horizontal cross sectional view of the semiconductor body 110 and FIG. 5C illustrates a perspective sectional view of the semiconductor body 110 in a region in which the Hall sensor 160 is implemented.

Referring to FIG. 5A, the transistor is implemented as a vertical trench transistor and includes a drift region 111, a body region 112, a source region 113 and a drain region 114. The source region 113 and the drain region 114 are arranged distant to each other in a vertical direction of the semiconductor body 110. The body region 112 is arranged between the source region 113 and the drift region 111, and the drift region 111 is arranged between the drain region 114 and the body region 112. A gate electrode 121 is arranged in a trench that extends from the first surface $110_1$ in a vertical direction into the semiconductor body 110. The gate electrode 121 is arranged adjacent to the body region 112 and is dielectrically insulated from the body region 112 by a gate dielectric 122. The transistor may include a plurality of transistor cells, where each transistor cell includes a source region 113, a body region 112 and a section of the gate electrode 121. The drift region 111 and the drain region 114 can be common to the individual transistor cells. The individual transistor cells are connected in parallel. For this, a source electrode 151 is electrically connected to the source regions 113 and the body regions 112 of the individual transistor cells. The source electrode 151 forms a first load terminal, and a drain electrode 152 that is electrically connected to the drain region 114 forms a second load terminal. In the embodiment illustrated in FIG. 5A, the source electrode 151 is arranged on a first surface $110_1$ of the semiconductor body and the drain electrode 152 is arranged on a second surface $110_2$ of the semiconductor body 110.

Referring to FIG. 5B, the gate electrode 121 may include a plurality of stripe-shaped (elongated) gate electrode sections, wherein the source and body regions 113, 112 are arranged between these sections of the gate electrode 121. Implementing the gate electrode 121 with stripe-shaped gate electrode sections is only an example. The gate electrode 121 could also be implemented as a grid with a rectangular or any other polygonal geometry. The individual sections of the gate electrode 121 are electrically connected to a common gate electrode G (schematically illustrated in FIG. 5A).

Like the transistor explained with reference to FIGS. 2A to 2C, the trench transistor of FIGS. 5A and 5B can be implemented as an n-type MOSFET or IGBT or as a p-type MOSFET or IGBT transistor and can be implemented as an enhancement or a depletion transistor. Concerning the doping types of the source region 113, the body region 112, the drift region 113 and the drain region 114 in a MOSFET or IGBT reference is made to the description of FIGS. 2A to 2C above which applies to the transistor according to FIG. 5A as well.

Just for explanation purposes it is assumed that the transistor is implemented as an n-type enhancement MOSFET. In this case, the source region 113, the drift region 111 and the drain region 114 are n-doped, while the body region 112 is p-doped. This MOSFET conducts a current I (schematically illustrated in FIG. 5A), when a positive voltage is applied between the drain terminal D electrically connected to the drain region 114 and the source terminal S electrically connected to the source electrode 151, and when a electrical potential is applied to the gate terminal G that generates a conducting channel in the body region 112 between the source region 113 and the drift region 111. This current causes a magnetic field B which is also schematically illustrated in FIGS. 5A and 5B. This magnetic field B can be sensed by the Hall sensor 160 in order to evaluate the load current I through the transistor.

In the transistor of FIG. 5A, the load path of the transistor includes the drift region 111. The source and drain terminals 151, 152 form first and second load terminals of the transistor. A first direction x in which the load path extends corresponds to a vertical direction of the semiconductor body 110. The Hall sensor 160 is arranged distant to the transistor in a second direction y that extends perpendicular to the first direction x. In the embodiment illustrated in FIG. 5A, the second direction y is a horizontal or lateral direction of the semiconductor body 110.

Referring to FIGS. 5A to 5C, the Hall sensor 160 includes a control electrode 163 that is dielectrically insulated from the semiconductor body 110 by a control electrode dielectric 164. Like the gate electrode 121, the control electrode 163 is arranged in a trench that extends from the first surface $110_1$ into the semiconductor body 110 in the vertical direction. This trench is a longitudinal trench that is orientated such that an interface area between the control electrode dielectric 164 and the semiconductor body 110 is at least approximately perpendicular to the second direction y. By applying a suitable potential to the control electrode 163, a region with high charge carrier mobility can be generated along this interface area. This region with high charge carrier mobility is similar to a 2DEG between a GaN layer and an AlGaN layer of a semiconductor body. The current supply terminals $161_1$, $161_2$ adjoin the control electrode dielectric 164 and are arranged distant to each other. In the embodiments illustrated in FIGS. 5B and 5C these current supply terminals $161_1$, $161_2$ are arranged distant to each other in a direction perpendicular to the second direction y. Further, these current supply terminals $161_1$, $161_2$ are arranged in the region of the first surface $110_1$ of the semiconductor body 110. However, this is only an example. These current supply terminals could also be arranged distant to the first surface $110_1$.

Referring to FIG. 5B, the first measurement terminal $162_1$ is arranged between the current supply terminals $161_1$, $161_2$. A second measurement terminal $162_2$ is either formed by the drain terminal (as illustrated in FIG. 5A), or is arranged distant to the first measurement terminal $162_1$ in the second direction y and separated from the first measurement terminal $162_1$ by the trench with the control electrode 163 and the control dielectric 164.

The current supply terminals $161_1$, $161_2$, the first measurement terminal $162_1$ and optionally the second measurement terminal $162_2$ are implemented as doped semiconductor regions. These semiconductor regions may be electrically connected to terminal electrodes (not illustrated in FIGS. 5A to 5C) for connecting the current source (see 81 in FIG. 3) and the voltage measurement device (see 82 in FIG. 3) thereto.

Referring to FIG. 5A, the control electrode 163 of the Hall sensor 160 is electrically connected to a control terminal C, which will also be referred to as Hall sensor control terminal C in the following. The control electrode 163 is configured to control an electrically conductive channel, such as an inversion channel, along the control electrode dielectric 164 between the current supply terminals $161_1$, $161_2$ and the measurement terminals $162_1$, $162_2$.

The current supply terminals $161_1$, $161_2$ and the measurement terminals $162_2$, $162_3$ are doped semiconductor regions that are doped complementarily to a first semiconductor region 165 which adjoins the control electrode dielectric 164 and in which the current supply terminals $161_1$, $161_2$ are embedded. According to one embodiment, the doping type of the current supply terminals $161_1$, $161_2$ corresponds to the doping type of the source regions 113 and the drift region 111, and the doping type of the first semiconductor region 165 corresponds to the doping type of the body region 112. In this case, the control electrode C can be electrically connected to the gate electrode G. In this case, the control electrode 163 generates a conducting channel between the current supply terminals $161_1$, $161_2$ and between the voltage measurement terminals $162_1$, $162_2$ each time the MOSFET is switched on, which is each time an electrical potential is applied to the gate electrode G that generates an inversion channel in the body region 112 between the source region 113 and the drift region 111. In this embodiment, the Hall sensor 160 is only activated when the MOSFET is switched on.

The first semiconductor region 165 in which the current supply terminals $161_1$, $161_2$ are arranged may have the same doping concentration as the body region 112 and may extend as deep into the semiconductor body 110 as the body region 112. Further, the dimension of the trench with the control electrode 163 may correspond to the dimension of the trench with the gate electrode 121. In this case, the trench with the control electrode 163 extends through the first semiconductor region 165 into a second semiconductor region 166 that may have a doping concentration corresponding to the doping concentration of the drift region 111. Dependent on whether the second measurement terminal $162_2$ is located at the first $110_1$ or is formed by the drain terminal D, an electrically conducting path between the first and second measurement terminals $162_1$, $162_2$ only extends along the gate dielectric 164 from the first measurement terminal $162_1$ on side of the trench around the bottom of the trench to the second measurement terminal $162_2$ on the other side of the trench, or extends from the first measurement terminal $162_1$ along the control electrode dielectric 164 and through the second semiconductor region 166 to the drain region 114 and the drain terminal 152.

The current supply terminals $161_1$, $161_2$ could be arranged at the positions of the measurement terminals $162_1$, $162_2$ and that the measurement terminals $162_1$, $162_2$ could be arranged at the positions of the current supply terminals $161_1$, $161_2$.

According to another embodiment, the current supply terminal $161_1$, $161_2$ and the measurement terminals $162_1$, $162_2$ are doped complementarily to the source regions 113 and the drift region 111, and the first semiconductor region 165 is doped complementarily to the body region 112. In this case the doping concentration and the doping type of the first region 165 may correspond to the doping type and the doping concentration of the second region 166. In this case an additional control circuit (not illustrated) is provided for controlling the generation of a conducting channel along the control electrode dielectric 164 between the individual terminals $161_1$, $161_2$, $162_1$, $162_2$. When the first region 165 is n-doped, a negative potential of the control electrode 163 relative to the potential of the first region 165 is required in order to generate a conducting channel along the control electrode dielectric 164.

Referring to FIG. 5A, an insulation layer 170 may be arranged between the transistor and the Hall sensor 160. This insulation layer 170 may extend in a vertical direction from the first surface $110_1$ to the drain region 114. The basic principle of providing a Hall sensor 160 that has a control electrode similar to a gate electrode of an MOS transistor is, of course not restricted, to be used in connection with a vertical trench transistor.

Figure 6A:
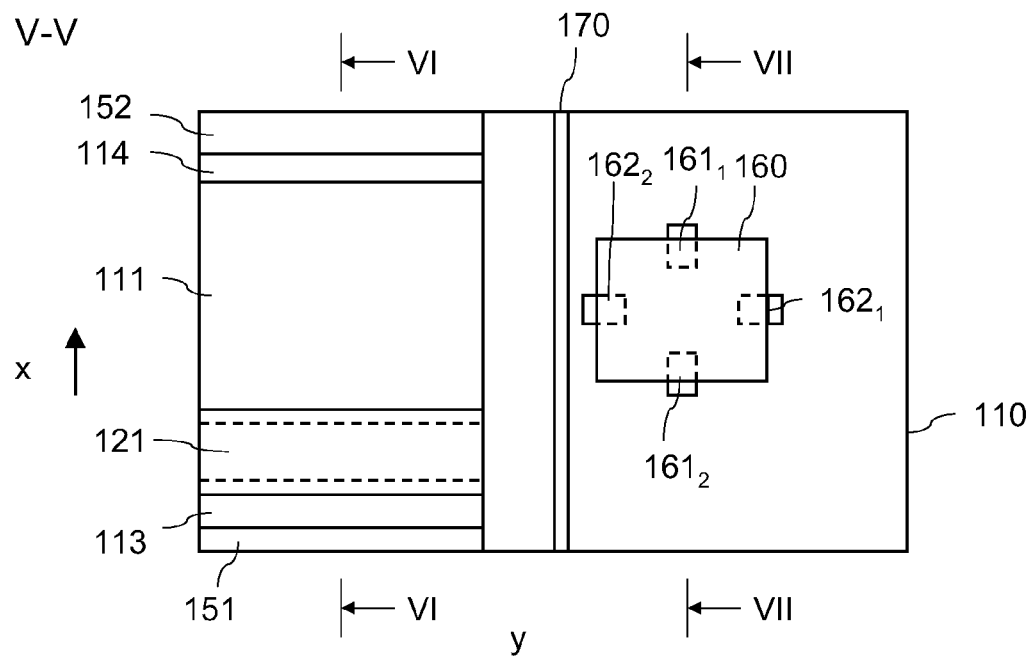
FIGS. 6A to 6C illustrates a further embodiment of a semiconductor arrangement including a transistor and a Hall sensor.
Figure 6B:
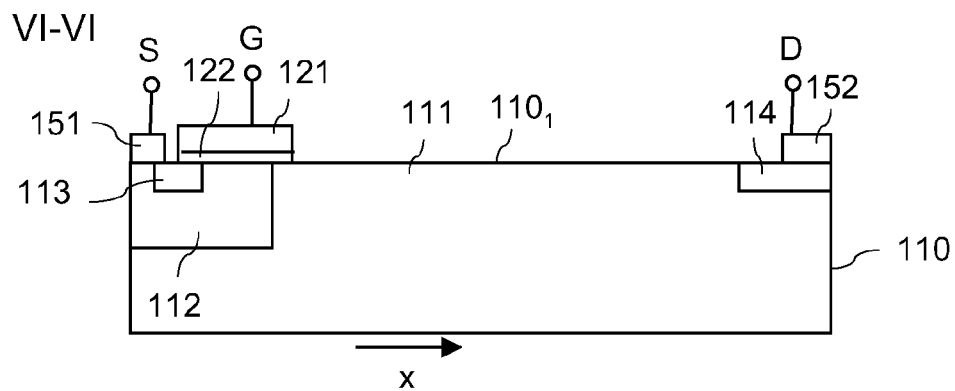
Figure 6C:
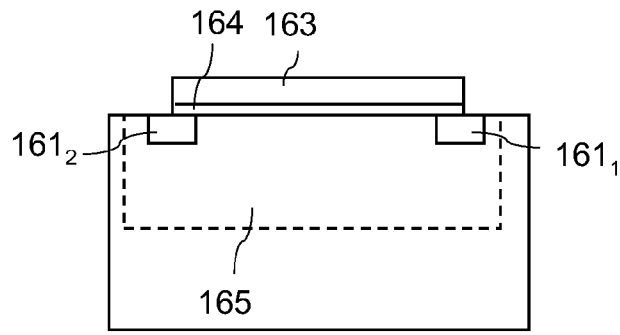

FIGS. 6A to 6C illustrate an embodiment of a semiconductor arrangement that includes a lateral MOS transistor. FIG. 6A illustrates a top view on the semiconductor body 110 in which the transistor and the Hall sensor are integrated, FIG.

6B illustrates a vertical cross sectional view in a region in which the transistor is implemented, and FIG. 6C illustrates a vertical cross sectional view in a region in which the Hall sensor is implemented.

Referring to FIGS. 6A and 6B, the transistor is implemented as a MOS transistor that includes a source region 113 and a drain region 114 arranged distant to each other in a first direction x, which is a horizontal direction of the semiconductor body 110. A source electrode 151 electrically connected to the source region 113 forms a first load terminal, and a drain electrode 152 electrically connected to the drain region 114 forms a second load terminal. The MOS transistor further includes a body region 112 and a drift region 111, where the body region 112 is arranged between the source region and the drift region 111 and the drift region 111 is arranged between the drain region 114 and the body region 112. A gate electrode 121 is arranged above the surface $110_1$ of the semiconductor body $110_1$ and is dielectrically insulated from the body region 112 by a gate dielectric.

Like the transistor explained with reference to FIGS. 2A to 2C and with reference to FIGS. 5A to 5C, the transistor of Figures &A and 6B can be implemented as an n-type MOSFET or IGBT or as a p-type MOSFET or IGBT transistor and can be implemented as an enhancement or a depletion transistor. Concerning the doping types of the source region 113, the body region 112, the drift region 113 and the drain region 114 in a MOSFET or IGBT reference is made to the description of FIGS. 2A to 2C above which applies to the transistor according to FIGS. 6A and 6B as well.

Referring to FIG. 6A, the Hall sensor 160 is arranged distant to the transistor in a second direction y that is perpendicular to the first direction and that, like the first direction x, is also a horizontal direction in this embodiment. The Hall sensor 160 includes a control electrode 163 that is arranged above the first surface $110_1$ and that is dielectrically insulated from the semiconductor body 110 by a control electrode dielectric 164. The current supply terminals $161_1$, $161_2$, and the current measurement terminals $162_1$, $162_2$ are doped regions and are at least partially arranged below the control electrode 163. The current supply terminals $161_1$, $161_2$ are arranged distant to each other in a third direction and the measurement terminals $162_1$, $162_2$ are arranged distant to each other in a fourth direction, where one of the third and fourth directions may correspond to the first direction, while the other one of the third and fourth directions may correspond to the second direction.

The current supply terminals $161_1$, $161_2$ and the measurement terminals $162_1$, $162_2$ are arranged in a first semiconductor region 165. Concerning the operating principle and concerning the doping types of the first semiconductor region 165 and the current supply terminals $161_1$, $161_2$ and the measurement terminals $162_1$, $162_2$ reference is made to the description of FIGS. 5A to 5C which applies to the Hall sensor of FIGS. 6A to 6C accordingly.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", an and the are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A semiconductor arrangement, comprising:
   a semiconductor body;
   a semiconductor device comprising first and second load terminals arranged distant to each other in a first direction of the semiconductor body, and a load path arranged in the semiconductor body between the first and second load terminals and connecting the first and second load terminals; and
   at least one Hall sensor arranged in the semiconductor body distant to the semiconductor device in a second direction perpendicular to the first direction and comprising two current supply terminals and two measurement terminals;
   wherein the at least one Hall sensor is arranged in the semiconductor body between imaginary planes extending in the second direction from each of the first and second load terminals of the semiconductor device and extending in a third direction, perpendicular to the first and second directions.

2. The semiconductor arrangement of claim 1, wherein the semiconductor body comprises a first semiconductor layer and a second semiconductor layer arranged adjacent in a vertical direction of the semiconductor body and a two dimensional electron gas (2DEG) between the first semiconductor layer and the second semiconductor layer, and wherein the load path of the semiconductor device includes a first section of the 2DEG.

3. The semiconductor arrangement of claim 2 wherein the Hall sensor comprises a second section of the 2DEG.

4. The semiconductor arrangement of claim 2, wherein the first layer comprises GaN and the second layer comprises AlGaN.

5. The semiconductor arrangement of claim 2, wherein the first direction is a horizontal direction of the semiconductor body and the second direction is a horizontal direction of the semiconductor body.

6. The semiconductor arrangement of claim 5, wherein the semiconductor body further comprises a trench arranged between the semiconductor device and the Hall sensor, the trench extending through the 2DEG.

7. The semiconductor arrangement of claim 6, wherein the trench is filled with an electrically insulating material; the electrically insulating material comprising an oxide or a nitride.

8. The semiconductor arrangement of claim 6, wherein the trench surrounds one of the semiconductor device and the Hall sensor in a horizontal plane of the semiconductor body.

9. The semiconductor arrangement of claim 2, wherein the semiconductor device is a transistor comprising a source terminal formed by the first load terminal, a drain terminal formed by the second load terminal, and a gate electrode arranged between the source and drain terminals, the gate electrode contacting the second semiconductor layer and arranged distant to the 2DEG in a vertical direction of the semiconductor body.

10. The semiconductor arrangement of claim 1, wherein the current supply terminals are arranged distant to each other in a first horizontal direction of the semiconductor body and the measurement terminals are arranged distant to each other in a second horizontal direction of the semiconductor body.

11. The semiconductor arrangement of claim 10, wherein one of the first and second horizontal directions corresponds to the first direction and the other one of the first and second horizontal directions corresponds to the second direction.

12. The semiconductor arrangement of claim 1, wherein the Hall sensor further comprises a control electrode arranged adjacent a semiconductor region arranged between the current supply terminals and the measurement terminals and dielectrically insulated from the semiconductor region by a control electrode dielectric.

13. The semiconductor arrangement of claim 12, wherein the semiconductor device is a MOS transistor and further comprises:
  a source region electrically connected to the first load terminal;
  a drain region electrically connected to the second load terminal;
  a drift region;
  a body region arranged between the source region and the drift region, the drift region being arranged between the body region and the drain region; and
  a gate electrode arranged adjacent the body region and dielectrically insulated from the semiconductor body by a gate dielectric.

14. The semiconductor arrangement of claim 12, wherein the control electrode is arranged in a trench extending in a vertical direction of the semiconductor body and the control electrode is implemented as a longitudinal electrode having a longitudinal direction.

15. The semiconductor arrangement of claim 14, wherein the terminals of a first pair selected from either the supply terminals or the measurement terminals are arranged distant to each other in the longitudinal direction of the control electrode.

16. The semiconductor arrangement of claim 15, wherein from the terminals of a second pair selected from either the supply terminals or the measurement terminals a first terminal is arranged between the terminals of the first pair of terminals.

17. The semiconductor arrangement of claim 16, wherein from the second pair of terminals the second terminal is separated from the first terminal by the trench comprising the control electrode.

18. The semiconductor arrangement of claim 16, wherein the semiconductor device is a MOS transistor and from the second pair of terminals the second terminal is formed by a drain terminal of the MOS transistor.

19. The semiconductor arrangement of claim 1, further comprising:
  a current source connected to the current supply terminals of the Hall sensor; and
  a voltage measurement device connected to the measurement terminals of the Hall sensor.

20. The semiconductor arrangement of claim 1, wherein the semiconductor arrangement comprises two Hall sensors arranged in the semiconductor body between the imaginary planes, the two Hall sensors being arranged on opposing sides of the semiconductor device from one another.

* * * * *